(12) United States Patent
Koster et al.

(10) Patent No.: US 6,614,505 B2
(45) Date of Patent: Sep. 2, 2003

(54) LITHOGRAPHIC PROJECTION APPARATUS, DEVICE MANUFACTURING METHOD, AND DEVICE MANUFACTURED THEREBY

(75) Inventors: Norbertus Benedictus Koster, Delft (NL); Bastiaan Matthias Mertens, 's-Gravenhage (NL); Martinus Hendrikus Antonius Leenders, Rotterdam (NL); Vladimir Vital'evitch Ivanov, Moscow (RU); Konstantin Nikolaevitch Koshelev, Troitsk (RU); Vadim Yevgenyevich Banine, Helmond (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 10/036,497

(22) Filed: Jan. 7, 2002

(65) Prior Publication Data

US 2002/0154279 A1 Oct. 24, 2002

(30) Foreign Application Priority Data

Jan. 10, 2001 (EP) .............................. 01300167

(51) Int. Cl.⁷ ............................... G03B 27/52
(52) U.S. Cl. ........................... 355/30; 355/67
(58) Field of Search ............................ 355/30, 67, 53, 355/77

(56) References Cited

U.S. PATENT DOCUMENTS

| 4,692,934 | A | | 9/1987 | Forsyth |
| 5,023,897 | A | | 6/1991 | Neff et al. |
| 5,430,303 | A | * | 7/1995 | Matsumoto et al. ...... 250/492.2 |
| 6,288,769 | B1 | * | 9/2001 | Akagawa et al. ............. 355/30 |

FOREIGN PATENT DOCUMENTS

| EP | 0 312 066 | 4/1989 |
| EP | 0 532 968 A1 | 3/1993 |
| EP | 0 858 249 | 8/1998 |
| EP | 0 957 402 A2 | 11/1999 |
| EP | 0 997 761 | 5/2000 |

OTHER PUBLICATIONS

A copy of the European Search Report issued in the corresponding European application.

* cited by examiner

Primary Examiner—Russell Adams
Assistant Examiner—D. Ben Esplin
(74) Attorney, Agent, or Firm—Pillsbury Winthrop LLP

(57) ABSTRACT

Contaminant particles travelling with a projection beam in a lithographic projection apparatus are ionized. A purge gas may be attracted towards getter plates provided upstream of the purge gas supply. A magnetic field traps electrons generated by the ionizer to improve the ionization of the purge gas. The contaminant particles can be ionized by generating a plasma in a tube having a greater length than width.

20 Claims, 2 Drawing Sheets

LITHOGRAPHIC PROJECTION APPARATUS, DEVICE MANUFACTURING METHOD, AND DEVICE MANUFACTURED THEREBY

BACKGROUND OF THE INVENTION

This application claims priority to EP 01300167.2, herein incorporated by reference in its entirety.

1. Field of the Invention

The present invention relates generally to lithographic projection apparatus and more particularly to lithographic projection apparatus including a contaminant barrier.

2. Background of the Related Art

Generally, lithographic projection apparatus in accordance with the present invention include a radiation system for supplying a projection beam of radiation, a support structure for supporting patterning structure, the patterning structure serving to pattern the projection beam according to a desired pattern a substrate table for holding a substrate and a projection system for projecting the patterned beam onto a target portion of the substrate.

The term "patterning structure" as here employed should be broadly interpreted as referring to means that can be used to endow an incoming radiation beam with a patterned cross-section, corresponding to a pattern that is to be created in a target portion of the substrate; the term "light valve" can also be used in this context. Generally, the said pattern will correspond to a particular functional layer in a device being created in the target portion, such as an integrated circuit or other device (see below). Examples of such patterning structure include:

- A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

- A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means. In both of the situations described hereabove, the patterning structure can comprise one or more programmable mirror arrays. More information on mirror arrays as here referred to can be gleaned, for example, from U.S. Pat. Nos. 5,296,891 and 5,523,193, and PCT patent applications WO 98/38597 and WO 98/33096, which are incorporated herein by reference. In the case of a programmable mirror array, the said support structure may be embodied as a frame or table, for example, which may be fixed or movable as required.

- A programmable LCD array. An example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning structure as hereabove set forth.

Lithographic projection apparatus can be used, for example, in the manufacture of integrated circuits (ICs). In such a case, the patterning structure may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer.

If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and WO 98/40791, incorporated herein by reference.

In a lithographic apparatus the size of features that can be imaged onto the substrate is limited by the wavelength of the projection radiation. To produce integrated circuits with a higher density of devices, and hence higher operating speeds, it is desirable to be able to image smaller features. While most current lithographic projection apparatus employ ultraviolet light generated by mercury lamps or excimer lasers, it has been proposed to use shorter wavelength radiation of around 13 nm. Such radiation is termed extreme ultraviolet (EUV) or soft x-ray and possible sources include, for instance, laser-produced plasma sources, discharge plasma sources, or synchrotron radiation from electron storage rings.

Some extreme ultraviolet sources, especially plasma sources, emit substantial amounts of contaminant molecules, ions and other (fast) particles. If such particles are allowed to reach the illumination system, which is of course downstream of the radiation source, or further downstream in the apparatus they can damage the delicate reflectors and other elements and cause build-up of absorbing layers on the surfaces of optical elements. Such damage and built-up layers cause an undesirable loss of beam intensity, increasing necessary exposure times and hence reducing machine through-put, and can be difficult to remove or repair. To prevent contaminant particles reaching the illumination system, it has been proposed to provide a physical barrier or window in the exit to the radiation system or the entrance to the illumination system. However, such a window is itself prone to damage from the contaminant particles and build-up of absorbing layers. Also, since most materials absorb extreme ultraviolet radiation at the wavelengths proposed for use in lithography, the window even when new and clean will absorb a significant proportion of the beam energy, reducing throughput. This absorption can cause thermal stress in the window even leading to breakage of the window.

EP-A-0 957 402 discloses a contamination barrier which uses a hollow tube, positioned between the last solid surface of the projection system and the substrate, and flushed with gas flowing towards the substrate to prevent contaminants emitted from the resist being deposited on the projection lens.

SUMMARY OF THE INVENTION

One aspect of embodiments of the present invention provides a contaminant barrier that may be used in a lithographic projection apparatus to remove undesirable contaminants, e.g. produced by a radiation source.

This and other aspects are achieved according to the invention in a lithographic apparatus as specified above, including a contaminant barrier comprising ionization means for ionizing a gas provided in a region traversed by said projection beam.

The ionization means can be, for example, an electron source or a plasma generated by capacitive or inductive RF discharge or ac discharge.

In one embodiment of the invention, getter plates are provided upstream (the terms upstream and downstream are used herein to indicate direction relative to the direction of propagation of the projection beam, unless the context otherwise requires) of the ionization means. The ionized gas and contaminants are attracted to the getter plates, which are negatively charged, and thus removal of the contaminants is enhanced. Such contaminants may, for example, be ions and charged particles emitted by the radiation source along with the desired radiation forming the projection beam. The ionization effect can be improved by providing a magnetic trap to trap free electrons downstream of the purge gas supply.

In a further preferred embodiment a plasma generated is confined to a tube having a greater length than width. Because the ions generated in the plasma have much greater masses than the electrons, their temperature will be much lower than that of the electrons. As the diffusion rate of particles is governed by their temperature the electrons will rapidly diffuse out of the plasma. Because of the length to width ratio of the tube in which the plasma is confined, electrons will preferentially move towards the walls of the tube than towards the ends of the tube. The deficiency of electrons in the plasma volume creates a charge polarization, causing the ions, both those of the source and those of the plasma, to follow the electrons out of the plasma towards the walls of the tube and become trapped. This ambipolar diffusion therefore aids removal of contaminants from the projection beam. The contaminant barrier is thus able to protect effectively the delicate optics of the illumination and projection systems from the particles emitted by the radiation source.

In a further embodiment of the present invention, the apparatus further comprises gas supply means to generate a flow of purge gas in a region traversed by the projection beam, said purge gas flow being substantially directed in the opposite direction to the direction of propagation of the projection. Because the gas flow in the contaminant barrier is largely against the direction of propagation beam, said purge gas effectively impedes the contaminants travelling with the projection beam.

The contaminant barrier of the present invention many be used, to advantage, with the contamination barrier of EP-A-0 957 402, mentioned above.

According to a further aspect of the invention there is provided a device manufacturing method comprising:

providing a substrate that is at least partially covered by a layer of radiation-sensitive material;

providing a projection beam of radiation using a radiation system;

using patterning structure to endow the projection beam with a pattern in its cross-section;

projecting the patterned beam of radiation onto a target portion of the layer of radiation-sensitive material, and ionizing a gas in a region traversed by the projection beam.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5–20 nm).

BRIEF DESCRIPTION OF THE DRAWINGS

Embodiments of the invention will now be described, by way of example only, with reference to the accompanying schematic drawings in which.

In the Figures, corresponding reference symbols indicate corresponding parts.

DETAILED DESCRIPTION OF EMBODIMENTS OF THE INVENTION

Embodiment 1

Figure 1:
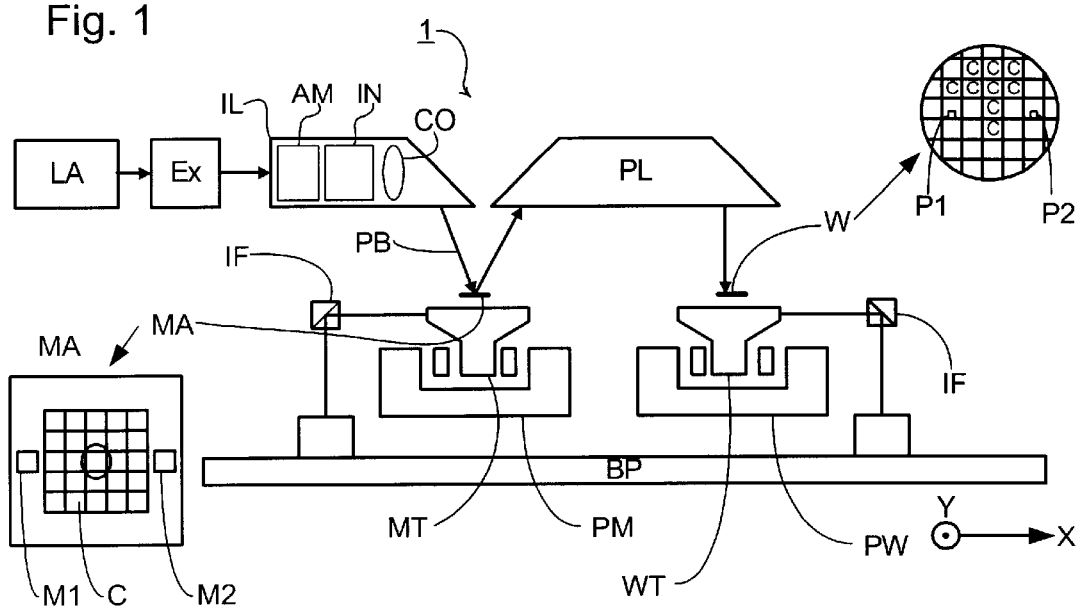
FIG. 1 depicts a lithographic projection apparatus according to an embodiment of the invention.

FIG. 1 schematically depicts a lithographic projection apparatus according to a particular embodiment of the invention. The apparatus comprises:

a radiation system LA, IL, for supplying a projection beam PB of radiation (e.g. EUV radiation), which in this particular case also comprises a radiation source LA;

a first object table (mask table) MT provided with a mask holder for holding a mask MA (e.g. a reticle), and connected to first positioning means PM for accurately positioning the mask with respect to item PL;

a second object table (substrate table) WT provided with a substrate holder for holding a substrate W (e.g. a resist-coated silicon wafer), and connected to second positioning means PW for accurately positioning the substrate with respect to item PL;

a projection system ("lens") PL (e.g. refractive, catadioptric or reflective system) for imaging an irradiated portion of the mask MA onto a target portion C (e.g. comprising one or more dies) of the substrate W.

As here depicted, the apparatus is of a reflective type (i.e. has a reflective mask). However, in general, it may also be of a transmissive type, for example (with a transmissive mask). Alternatively, the apparatus may employ another kind of patterning structure, such as a programmable mirror array of a type as referred to above.

The source LA (e.g. a laser-produced plasma source, a discharge plasma source or an undulator or wiggler provided around the path of an electron beam in a storage ring or synchrotron) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and claims encompass both of these scenarios.

The beam PB subsequently intercepts the mask MA, which is held on a mask table MT. Having been selectively reflected by the mask MA, the beam PB passes through the lens PL, which focuses the beam PB onto a target portion C of the substrate W. With the aid of the second positioning means PW (and interferometric measuring means IF), the substrate table WT can be moved accurately, e.g. so as to position different target portions C in the path of the beam PB. Similarly, the first positioning means PM can be used to accurately position the mask MA with respect to the path of the beam PB, e.g. after mechanical retrieval of the mask MA from a mask library, or during a scan. In general, movement of the object tables MT, WT will be realized with the aid of a long-stroke module (course positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed.

The depicted apparatus can be used in two different modes:

In step mode, the mask table MT is kept essentially stationary, and an entire mask image is projected at once (i.e. a single "flash") onto a target portion C. The substrate table WT is then shifted in the x and/or y directions so that a different target portion C can be irradiated by the beam PB;

In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 2:
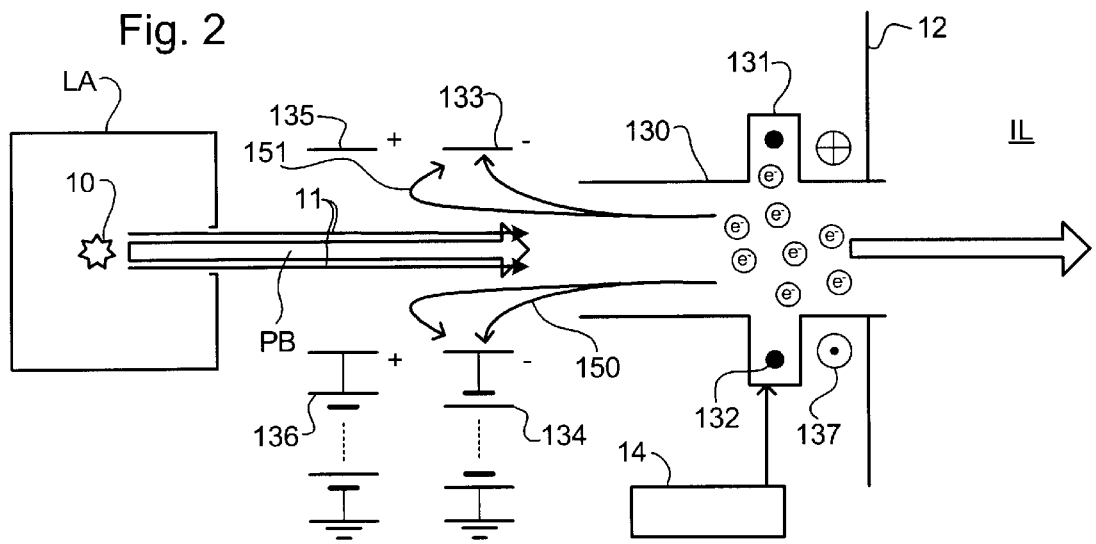
FIG. 2 shows a contaminant barrier in the first embodiment.

The radiation source LA, illumination system IL and projection system PL may be contained in respective compartments ("boxes") which are evacuated or flushed with a gas transparent to the radiation of the projection beam. The projection beam is passed between the different compartments through openings in their walls. The arrangement for passing the projection beam PB from the radiation source LA to illumination system IL is shown in greater detail in FIG. 2.

As well as the projection beam PB of desired radiation, the emission source 10 within the radiation source LA emits a beam of contaminant particles 11, particularly if a discharge or laser-produced plasma source is used. Aligned apertures are provided in the compartments of the radiation source LA and illumination system IL to allow the projection beam PB to pass from the radiation source LA to illumination system IL. The contaminant particle beam 11 unavoidably travels with the projection beam PB and must be prevented from entering the illumination system IL. To this end a tube 130 projects from the wall 12 of the compartment of the illumination system IL around the aperture that allows in the projection beam PB.

The tube 130 is filled with gas and surrounds the aperture in the illumination system compartment 12. The illumination system compartment 12 is evacuated to reduce absorption of the projection beam PB. An ionization means, for example an electron source 132, is provided at the downstream end of the tube 130 (i.e. near the illumination system IL).

The electrons emitted by the electron source 132 ionize the gas and any contaminant particles. Positively charged ions and particles 150 are then attracted by the negatively charged collector plates 133 so the gas flows outwardly from the illumination system compartment 12, creating an effective gas barrier.

Upstream of the collector plates 133, positively charged repeller plates 135 are provided to repel any ions or charged particles 151 that overshoot the collector plates 133 and direct them back onto the collector plates 133.

Appropriate voltage sources 134, 136 are provided to charge the collector plates 133 and repeller plates 135 to an appropriate potential relative to the electron source 132. The exact potentials will depend on the dimensions of the apparatus as well as factors such as the rate and speed of contaminant particles accompanying the projection beam PB. For example, the electron source 132 may be at a potential of about +100V, the collector plates at about −1 kV and the repeller plates at +1 kV.

To improve the ionization of the gas, a magnetic trap formed by coils 137 can be provided on the clean (illumination system) side of the tube 130. The coils 137 generate a magnetic field which traps free electrons increasing the ionization of any gas moving towards the clean side of the particle trap. The ionized gas is then attracted back towards the collector plates 133, inducing a counter flow of gas. A potential slightly higher than the electron source 132, e.g. 130V, may also be provided to assist in trapping the electrons. Negatively charged particles emitted from the radiation source 10 will also be trapped in the electron trap and will contribute to ionization of the gas. Damage to and deposition on optical elements, e.g. mirror MR, in the illumination system are thereby avoided.

The gas to be ionized may be present due to operation of the radiation source or any other reason, or may be supplied for the present purpose via supply means 14.

Embodiment 2

Figure 3:
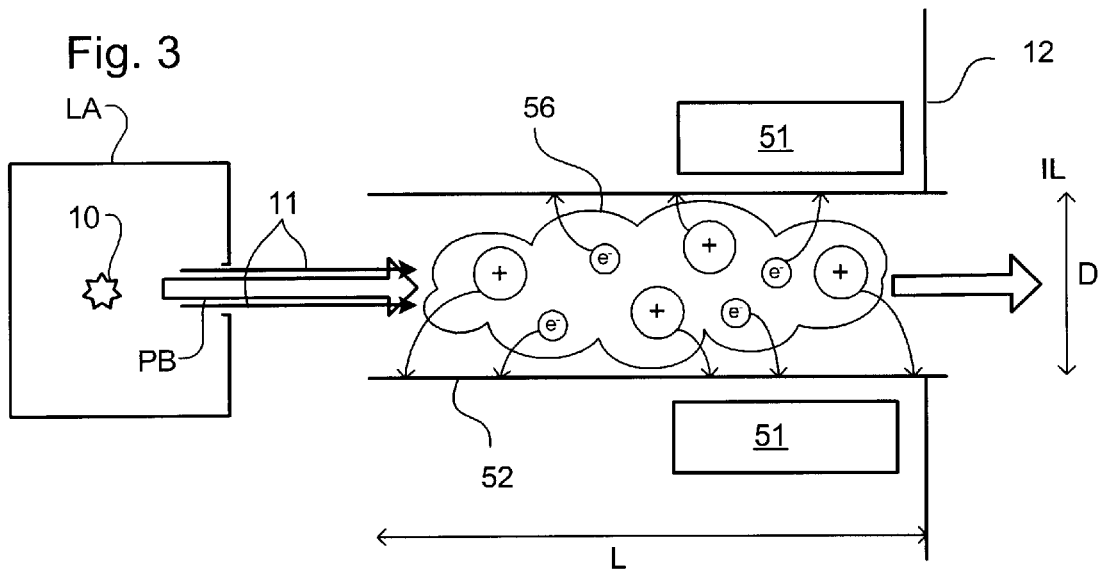
FIG. 3 shows a contaminant barrier according to a second embodiment of the invention.
Figure 4:
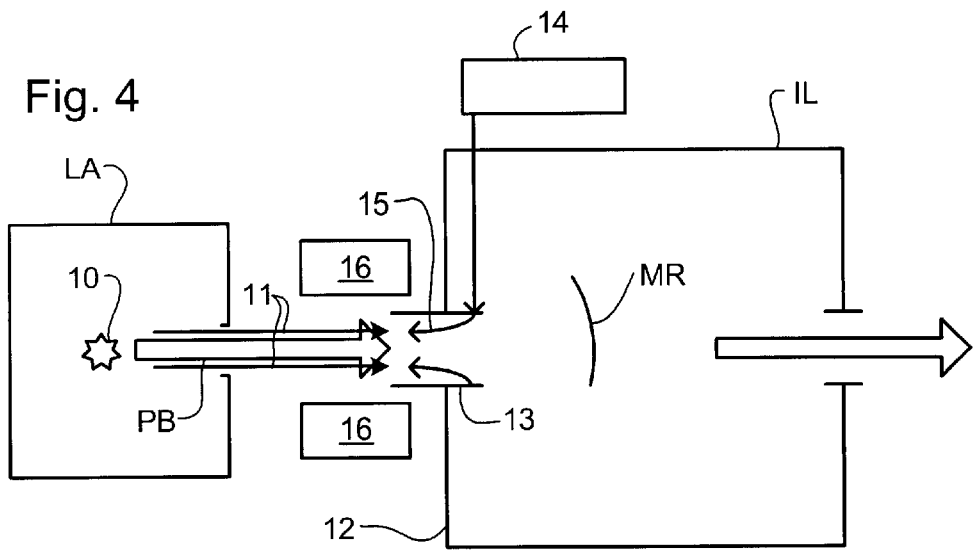
FIG. 4 shows a third embodiment of the present invention.

A second embodiment of the invention is similar to the first embodiment save in that the gas is ionized by generating a plasma and ambipolar diffusion used to remove contaminants. FIG. 3 shows the arrangement for generating the plasma, which replaces the ionization means shown in FIG. 2.

A plasma 56 of, in this embodiment, noble gases is generated by a plasma generating means 51 which uses, for example, capacitively or inductively coupled RF discharges, or an a/c discharge, for instance, in the frequency range 10 kHz–20 MHz. The electron energy in the plasma 56 should preferably be 10–20 eV or there should be a great concentration of electrons in a high level metastable state. Although other gases can be used in the plasma 56, noble gases are advisable and in particular He and Ar provide for effective ionization.

As depicted in FIG. 3 the plasma 56 is in a tube 52 having a greater length L than width D. Due to their high temperature the electrons diffuse rapidly and are trapped by the walls of the tube 52. A charge polarization is therefore created between the electron deficient plasma 56 and the electron rich walls of the tube 52, causing the ions remaining in the plasma 56 to be attracted to the walls of the tube 52 and out of the projection beam PB. The plasma 56 thus created effectively ionizes any contaminants, for example Li and other metals present in the contaminant flow, which then preferentially and very effectively diffuse towards walls of tube 52, as described.

The getter plates and repeller plates of the first embodiment can be used with the plasma ionizer of the second embodiment but may not be necessary; ambipolar diffusion can be sufficient to remove the contaminants.

Embodiment 3

In a third embodiment of the present invention, which may the same as the first or second embodiments of the invention save as described below, a flow of purge gas is provided to impede the contaminant flow towards the illumination system.

A purge gas supply 14 supplies clean, dry purge gas to outlets (not shown) in the interior wall of the tube 13 to establish a flow 15 of purge gas down the tube toward the radiation source LA. The purge gas may be, for example, a pure inert or noble gas or a mixture of such gases that has a minimum absorption coefficient to the radiation of the projection beam.

The purge gas flow 15 intercepts and sweeps up the particles of contaminant particle beam 11 and carries them away from the illumination system IL. Exhaust systems 16 are provided either side of the projection beam PB between the radiation source LA and illumination system IL to remove the purge gas flow and entrained contaminant particles. Vacuum pumps in the exhaust systems 16 extract the purge gas at a sufficient rate to ensure the gas pressure in the region traversed by the projection beam remains low enough to avoid undesirable attenuation of the projection beam while the purge gas flow is sufficient to sweep up and extract contaminant particles. The exhaust systems 16 may be part of or mounted on the radiation source chamber, or separate therefrom. A more effective contaminant barrier is thereby generated.

It will be appreciated that, while the contaminant barrier, also referred to as a particle trap, in the above embodiments are shown between the compartments of the radiation source LA and illumination system IL, a particle trap may alternatively or in addition be placed between the illumination system IL and projection system PL, between separate compartments of the illuminator, between substrate and projection system to mitigate debris due to resist outgassing or, generally, between any "contaminant" and "clean" environments in the lithographic apparatus.

While specific embodiments of the invention have been described above, it will be appreciated that the invention may be practiced otherwise than as described. The description is not intended to limit the invention.

What is claimed is:

1. A lithographic projection apparatus for imaging a mask pattern in a mask onto a substrate, the apparatus comprising:
   an illumination system constructed and arranged to supply a projection beam of radiation;
   a first object table constructed to hold a mask;
   a second object table constructed to hold a substrate;
   a projection system constructed and arranged to image an irradiated portion of the mask onto a target portion of the substrate; and
   a contaminant barrier comprising an ionizer which is constructed and arranged to ionize a gas provided in a region traversed by said projection beam.

2. Apparatus according to claim 1 wherein said ionizer comprises an electron source.

3. Apparatus according to claim 1 wherein said ionizer is configured and arranged to generate a plasma to be confined in a tube having a greater length than width.

4. Apparatus according to claim 3 wherein the plasma is generated by at least one of capacitive RF discharges, inductive RF discharges and a/c discharge.

5. Apparatus according to claim 3 wherein the plasma has an average electron energy in the range 10–20 eV.

6. Apparatus according to claim 1 wherein said contaminant barrier further comprises getter plates, and a voltage source for charging said getter plates negatively relative to said ionizer, said getter plates being positioned upstream, relative to the direction of propagation of said projection beam, of the ionizer.

7. Apparatus according to claim 6 wherein said contaminant barrier further comprises repeller plates, positioned upstream, relative to the direction of propagation of the projection beam, of said getter plates; and a second voltage source for charging said repeller plates positively relative to said getter plates.

8. Apparatus according to claim 6 wherein said contaminant barrier further comprises a magnetic field generator to generate a magnetic field to trap free electrons, said magnetic field generator being positioned downstream, relative to the direction of propagation of said projection beam, of said ionizer.

9. Apparatus according to claim 1 wherein said gas is a noble gas.

10. Apparatus according to claim 9 wherein said noble gas is He or Ar.

11. Apparatus according to claim 1 wherein said contaminant barrier is positioned at the input of the projection beam to the illumination system.

12. Apparatus according to claim 1, wherein said contaminant barrier is positioned between the illumination system and the projection system.

13. Apparatus according to claim 1, wherein said contaminant barrier is positioned between the second object table and the projection system.

14. Apparatus according to claim 1 wherein said contaminant barrier further comprises:
   a gas supply constructed and arranged to provide a flow of said gas in said region traversed by the projection beam, said gas flow being substantially directed in the opposite direction to the direction of propagation of contaminant particles.

15. Apparatus according to claim 14 wherein said contaminant barrier comprises a conduit surrounding said region traversed by said projection beam, said gas supply, in use, supplying gas to said conduit; and
   an exhaust positioned upstream, relative to the direction of propagation of the projection beam, of the gas supply means which removes said purge gas from said region traversed by said projection beam.

16. Apparatus according to claim 1 further comprising one of a laser-produced and a discharge, plasma radiation source.

17. Apparatus according to claim 1 wherein said projection beam comprises extreme ultraviolet radiation having a wavelength in the range of from 8 to 20 nm.

18. Apparatus according to claim 17 wherein said projection beam comprises extreme ultraviolet radiation having a wavelength in the range of from 9 to 16 nm.

19. A device manufacturing method using a lithography apparatus comprising:
   irradiating portions of a mask with a projection beam of radiation and imaging said irradiated portions of said mask onto target portions of said substrate having a radiation sensitive material thereon; and
   ionizing a gas in a region traversed by the projection beam using a source of ionizing radiation other than the projection beam of radiation.

20. A device manufactured by the method of claim 19.

* * * * *